United States Patent [19]

Yamada et al.

[11] Patent Number: 5,543,357

[45] Date of Patent: Aug. 6, 1996

[54] PROCESS OF MANUFACTURING A SEMICONDUCTOR DEVICE BY FILLING A VIA HOLE IN AN INTERLAYERED FILM OF THE DEVICE WITH WIRING METAL

[75] Inventors: Yoshiaki Yamada; Nobukazu Ito; Kuniko Miyakawa; Michiko Yamanaka, all of Tokyo, Japan

[73] Assignee: NEC Corporation, Tokyo, Japan

[21] Appl. No.: 351,679

[22] Filed: Dec. 8, 1994

[30] Foreign Application Priority Data

Dec. 8, 1993 [JP] Japan .................... 5-308244

[51] Int. Cl.$^6$ .................................. H01L 21/28
[52] U.S. Cl. .......................... 437/192; 437/194
[58] Field of Search ...................... 437/192, 194, 437/190; 304/192.35

[56] References Cited

U.S. PATENT DOCUMENTS

| | | | |
|---|---|---|---|
| 5,266,521 | 11/1993 | Lee et al. | 437/192 |
| 5,356,836 | 10/1994 | Chen et al. | 437/194 |
| 5,371,042 | 12/1994 | Ong | 437/194 |

FOREIGN PATENT DOCUMENTS

| | | | |
|---|---|---|---|
| 02186634 | 7/1990 | Japan | 437/192 |
| 03188267 | 8/1991 | Japan . | |
| 06020994 | 1/1994 | Japan | 437/192 |

OTHER PUBLICATIONS

"Al–Plaph (Aluminum–Planarization by Post–Heating) Process for planarized Double CMOS Applications", C. S. Park, S. I. Lee, J. H. Park, J. H. Sohn, D. Chin, J. G. Lee, Jun. 11–12, 1991 VMIC Conference, pp. 326–328.

"Quarter, Micron Hole Filling with SiN sidewall by aluminum High temperature sputtering", M. Taguchi, K. Koyama, Y. Sugano, Jun. 9–10, 1992 VMIC Conference, pp. 219–225.

Primary Examiner—George Fourson
Assistant Examiner—Thomas G. Bilodeau

[57] ABSTRACT

The present invention discloses a process for manufacturing a semiconductor device in which characteristics of an aluminum alloy film are prevented from deteriorating, when a titanium film is used as an under film and the aluminum alloy film is heated to fill a via hole therewith. Interlayered insulating film is formed on a first aluminum wire, and after the formation of a via hole which reaches the first aluminum wire, a titanium film and an aluminum alloy film are formed in turn by a sputtering process. Next, a silicon substrate is heated up to 450° to 500° C. to melt the aluminum alloy film, thereby filling the via hole therewith. In this case, the thickness of the titanium film is set to 10% or less of the thickness of the aluminum alloy film and at most 25 nm. In particular, in the case of the aluminum alloy film containing no silicon, the thickness of the titanium film is set to 5% or less of the thickness of the aluminum alloy film, whereby the deterioration of characteristics of the aluminum alloy film by titanium can be minimized, and the via hole can be surely filled therewith.

5 Claims, 5 Drawing Sheets

PROCESS OF MANUFACTURING A SEMICONDUCTOR DEVICE BY FILLING A VIA HOLE IN AN INTERLAYERED FILM OF THE DEVICE WITH WIRING METAL

BACKGROUND OF THE INVENTION (a) Field of the Invention

The present invention relates to a process for manufacturing a semiconductor device, and more specifically, it relates to a process for manufacturing a semiconductor device in which a via hole formed in an interlayered insulating film is filled with a wiring metal.

(b) Description of the Related Art

With the high integration of semiconductor devices, a transverse size of elements and wires is being miniaturized more and more. However, the miniaturization of a vertical size, i.e., the miniaturization of the vertical size of interlayered insulating films and wires does not progress because of the increase in a wire capacity, a poor dielectric strength of the interlayered insulating films and the like. Therefore, there increases a ratio (aspect ratio) of the diameter to the depth of a via hole which is provided through the interlayered insulating film in order to connect a wire to an element or a lower wire or the like. Therefore, step coverage properties in the via hole of a metal film such as an aluminum alloy formed by a usual sputtering process are poor, and it is difficult to meet required characteristics.

In the case that this metal film is an aluminum-based alloy film comprising aluminum or an aluminum alloy, there have been suggested various methods for improving the step coverage properties by the utilization of a fact that this metal film has a low melting point. One of these methods is a bias sputtering process in which a DC or a RF bias is applied to a semiconductor substrate during the sputtering of the aluminum alloy film. In this method, the kinetic energy of argon ions struck on the semiconductor substrate is converted into heat energy, so that the aluminum alloy film is molten, whereby the step coverage properties of this aluminum alloy film can be improved. In this method, however, the element is damaged and the aluminum alloy film is degraded by the argon ions struck on the surface of the semiconductor substrate, and these problems have not been solved yet. For this reason, the bias sputtering process has not been put to practical use.

In addition to the bias sputtering process, another method has been suggested in which the aluminum alloy film is formed by the usual sputtering process, and laser beams or electron beams are then struck on the aluminum alloy film to melt the same, thereby improving the step coverage properties of the aluminum alloy film. For example, a method of melting the aluminum alloy film by the electron beams is disclosed in Japanese Patent Application Laid-open No. 188267/1991.

Figure 3A:
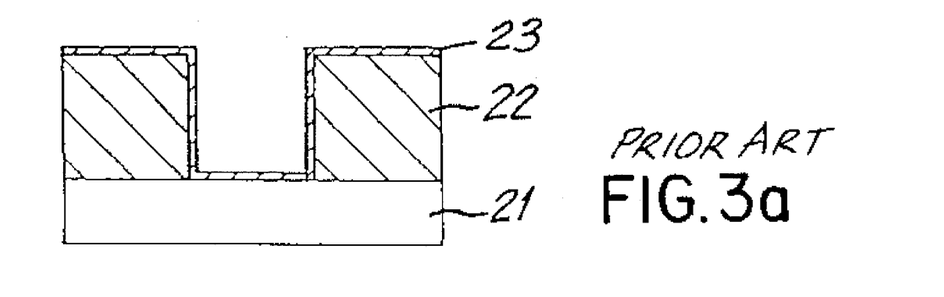
FIGS. 3a–3c are sectional views illustrating the main process of one embodiment of a conventional technique.
Figure 3B:
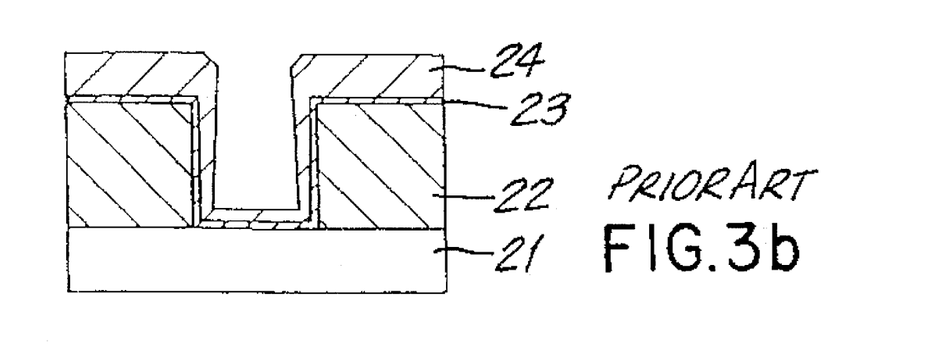
Figure 3C:
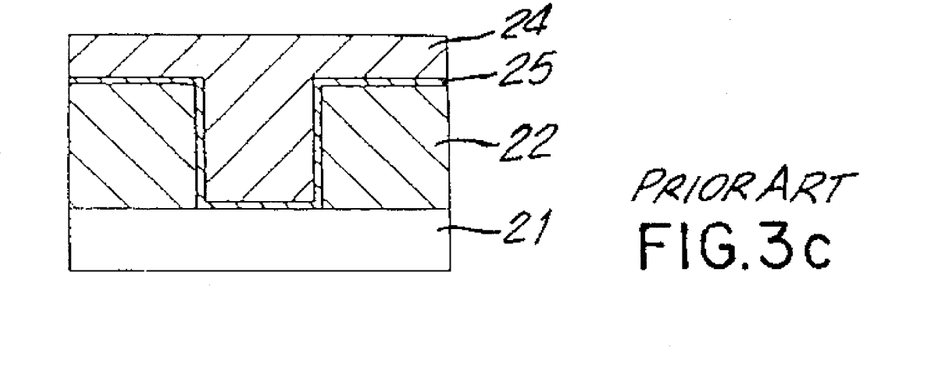

This method will be described with reference to drawings. FIGS. 3a–3c are sectional views illustrating the main process of this method. As shown in FIG. 3(a), a contact hole for connecting to an element is formed at a desired position of an interlayered insulating film 22 comprising a PSG film (phosphosilicate glass) on a silicon substrate 21 provided with the element, and a titanium film 23 having a thickness of about 50 to 100 nm is then formed so as to cover the interlayered insulating film 22 or the contact hole by a sputtering process.

Next, as shown in FIG. 3(b), an aluminum alloy film 24 having a thickness of 0.4 to 1.5 μm is formed by a usual sputtering process. Afterward, as shown in FIG. 3(c), the silicon substrate is maintained at a temperature of 400° C., and the aluminum alloy film 24 is then molten by the irradiation of electron beams to fill the contact hole with the molten aluminum alloy. In this case, the energy of the electron beams to be irradiated is about 100 μsec at 1 to 3 keV and at a current of 15 to 35 A. These serial processing steps are preferably carried out in one vacuum atmosphere, and in particular, the formation of the titanium film 23 and the aluminum alloy film 24 is done in the one vacuum atmosphere so that any oxide film may not be interposed therebetween, with the result that the wetting property of the aluminum alloy film is good and the filling of the contact hole is easy.

Furthermore, another method has also been suggested in which the aluminum alloy film is molten only by the heating of the substrate without using any energy beams such as the laser beams or the electron beams. For example, as reported in Proceeding of 1991 VMIC Conference, pp. 326–328, the aluminum alloy film is formed at a low temperature of 100° C. or less by the usual sputtering process, and the semiconductor substrate is then heated at 400° to 550° C. in one vacuum atmosphere to melt the aluminum alloy film.

Alternatively, as reported in Proceeding of 1992 VMIC Conference, pp. 219–225, a barrier metal film is formed, and the aluminum alloy film is then formed, while the semiconductor substrate is heated at about 500° C., to melt the aluminum alloy film. As the barrier metal film, a titanium film, a TiON film and a TiN film have been tried, but the titanium film is most excellent in wetting to the aluminum alloy film and is easy to fill the contact hole.

Figure 4:
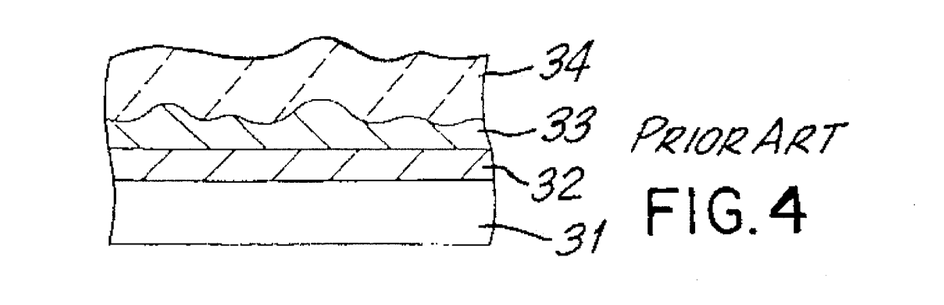
FIG. 4 is a sectional view illustrating problems of the conventional technique.

In a conventional method for manufacturing the semiconductor device in which this silicon substrate is heated to a high temperature and the aluminum alloy film is then formed, the titanium film is as thick as about 100 nm, and so a TiAlx alloy layer which is formed by the reaction of the aluminum alloy film and the titanium film is also thick. This TiAlx alloy layer is not uniformly formed, and as shown in FIG. 4, its film thickness is nonuniform and wavy. The thicker the formed TiAlx layer is, the wavier the surface of the TiAlx alloy layer is. Hence, the aluminum alloy film on the TiAlx alloy layer is affected by this TiAlx alloy layer, and thus it also becomes wavy. The surface state of the aluminum alloy film is particularly bad at the step portion.

If the surface state of the aluminum alloy film is bad, it is difficult to achieve precise positioning to the contact hole and a through hole, when a photoresist film formed on the aluminum alloy film is patterned to a desired shape of an aluminum wire. In an extreme case, the positioning is quite impossible.

Furthermore, in the case that a wire is formed from the layered structure of the titanium film and the aluminum alloy film, the thus formed wire is then covered with an interlayered insulating film or a passivation film, followed by a heat treatment at about 400° C. At this time, the aluminum alloy film is partially lost by the stress of the interlayered insulating film or the passivation film. That is to say, the so-called stress migration easily occurs. In particular, the thicker the titanium film is, the more easily the stress migration occurs and the more easily the wire breaks inconveniently.

If titanium gets into the aluminum alloy film, the resistance of the aluminum alloy film increases. When the titanium film is thick, a large amount of titanium gets into the aluminum alloy film, and the TiAlx alloy layer in the contact hole is also thickly formed, so that there is a problem that the wire resistance increases.

As described above, in the method for preparing this kind of semiconductor which comprises forming the aluminum alloy film at the high temperature to fill the via hole therewith, the titanium film having a thickness of about 100 nm is used, but the reason why such a thick titanium film is used will be described as follows.

Figure 5A:
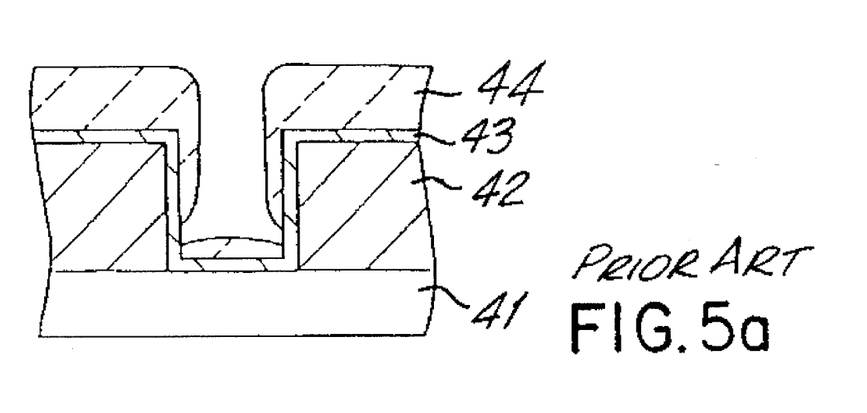
FIGS. 5a and 5b are sectional views of a process illustrating the problems of the conventional technique.
Figure 5B:
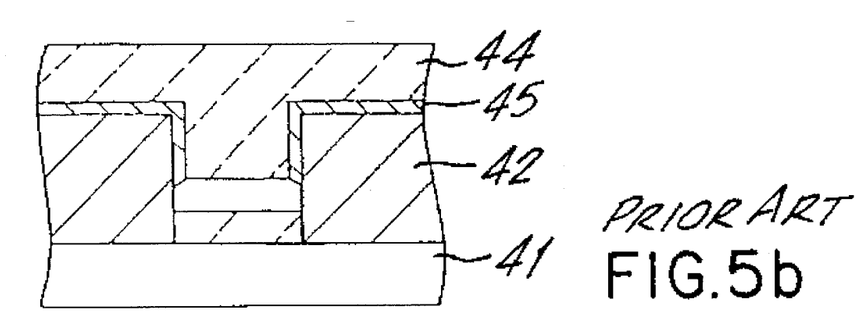

When the aluminum alloy film is formed at a high temperature, the aluminum alloy is easily flowable, and so, before the melting of the formed aluminum alloy film, the aluminum alloy film is easily separated at the contact hole into an upper portion and a bottom portion, as shown in FIG. 5(a). If the titanium film is thin and it does not have a sufficient film thickness on the side wall of the hole, the flow of the aluminum alloy film does not reach the bottom of the hole owing to the discontinuous aluminum alloy film, even when the aluminum alloy film is molten. In consequence, disconnection occurs, as shown in FIG. 5(b). However, if the titanium film is thick and has the sufficient film thickness on the side wall of the hole, titanium is replaced with aluminum and the aluminum alloy film on the upper portion of the hole flows into the hole, so that the surface of the aluminum alloy film can be flattened. Therefore, the film thickness necessary for the titanium film is at least about 50 to 100 nm, depending upon the aspect ratio of the hole.

As reported in Proceedings of 1992 VMIC Conference, pp. 219–225 mentioned above, oxygen in the interlayered insulating film oxidizes the titanium film to deteriorate filling properties. Therefore, when the titanium film is directly formed on the interlayered insulating film, the titanium film having a thickness of about 100 nm or more is necessary so as to accept the slight oxidation of the titanium film.

In the method in which after the formation of the aluminum alloy film, the aluminum alloy film is molten by the irradiation of the laser beams or the electron beams, the surface of the aluminum alloy film is oxidized, and so the temperature of the aluminum alloy film reaches a high level of 550° C. or more. If the temperature of the aluminum alloy film is so high and the titanium film is thin, the aluminum alloy film tends to aggregate in the form of grains. In order to prevent this tendency, the titanium film is also required to have a film thickness of about 50 to 100 nm.

In the method in which after the formation of the aluminum alloy film at a low temperature by the usual sputtering, the silicon substrate is heated to melt the aluminum alloy film, there is not any report that the titanium film is used as an under film for the aluminum alloy film, but the film thickness of about 50 to 100 nm is often used, as in the other methods.

In particular, when a base pressure in a process chamber in which the aluminum alloy film is formed and the substrate is heated is higher than $10^{-7}$ Torr, the aluminum alloy film is oxidized, so that it scarcely flow. In order to make the aluminum alloy film flowable, it is necessary to heat the aluminum alloy film to a high temperature, but if the aluminum alloy film is heated to the high temperature and the thin titanium film is used, the aluminum alloy is inconveniently liable to become grains. In consequence, the titanium film is still required to possess a film thickness of about 50 to 100 nm.

Instead of directly forming the titanium film on the interlayered insulating film, a TiN film may be formed as a barrier metal for preventing the interdiffusion of aluminum, silicon and the like, and the titanium film may be then formed thereon. In this case, the oxidation of the titanium film does not have to be considered and unreacted titanium is present in the TiN film, and so the titanium film can be thinned. In general, a thickness of about 30 to 50 nm is often used.

Even if the titanium film is thinned to about 30 to 50 nm, problems such as the bad state on the surface of the aluminum alloy film and the deterioration of a stress migration resistance cannot be solved.

Therefore, it is usually unavoidable to set the film thickness of the titanium film to about 50 to 100 nm.

SUMMARY OF THE INVENTION

An object of the present invention is to provide a process for manufacturing a semiconductor device in which characteristics of an aluminum alloy film are prevented from deteriorating, when a titanium film is used as an under film and the aluminum alloy film is heated to fill a via hole therewith.

That is to say, more specifically, according to the manufacturing process of the present invention, a second interlayered insulating film is formed on a first aluminum wire, and after the formation of a via hole which reaches the first aluminum wire, a titanium film and an aluminum alloy film are formed in turn by a sputtering process. Next, a silicon substrate is heated up to 450° to 500° C. to melt the aluminum alloy film, thereby filling the via hole therewith. In this case, the thickness of the titanium film is set to 10% or less of the thickness of the aluminum alloy film and at most 25 nm. In particular, in the case of the aluminum alloy film containing no silicon, the thickness of the titanium film is set to 5% or less of the thickness of the aluminum alloy film, whereby the deterioration of characteristics of the aluminum alloy film by titanium can be minimized, and the via hole can be surely filled therewith.

DESCRIPTION OF SYMBOLS:

1, 11, 21, 31, 41 . . . Silicon substrate

2 . . . First interlayered insulating film

3 . . . First aluminum wire

4 . . . Second interlayered insulating film 5, 23, 43 . . . Titanium film 6, 17, 24, 34, 44 . . . Aluminum alloy film 7, 25, 33, 45 . . . TiAlx alloy layer 12, 22, 32, 42 . . . Interlayered insulating film 13 . . . First titanium film 14 . . . TiN film 15 . . . Ti silicide 16 . . . second titanium film 18 . . . AlTiSi alloy layer

DETAILED DESCRIPTION OF THE INVENTION

A first aspect of the present invention is directed to a process for manufacturing a semiconductor device which comprises a step of forming a titanium film on a via hole and an interlayered insulating film through which the via hole extending to a semiconductor element or a lower wire is formed; a step of forming an aluminum film or an aluminum alloy film at a low temperature by a sputtering process; and a step of heating a substrate to fluidize the aluminum film or the aluminum alloy film, thereby filling the via hole therewith; said method being characterized in that the thickness of the titanium film is 10% or less of the thickness of the aluminum film or the aluminum alloy film and 25 nm or less.

A second aspect of the present invention is directed to a process for manufacturing a semiconductor device in which in the case of the aluminum film or the aluminum alloy film containing no silicon, the thickness of the titanium film is 5% or less of the thickness of the aluminum film or the aluminum alloy film and 25 nm or less.

A third aspect of the present invention is directed to a process for manufacturing a semiconductor device in which the aluminum film or the aluminum alloy film is formed at a substrate temperature of 200° C. or less by a sputtering process.

A fourth aspect of the present invention is directed to a process for manufacturing a semiconductor device in which at least the step of forming the aluminum film or the aluminum alloy film and the step of heating the substrate to fluidize the aluminum film or the aluminum alloy film, thereby filling the via hole therewith are carried out in one vacuum atmosphere.

A fifth aspect of the present invention is directed to a process for manufacturing a semiconductor device in which a base pressure of a chamber, where the step of forming the aluminum film or the aluminum alloy film and the step of heating the substrate to melt the aluminum film or the aluminum alloy film and to thereby fill the via hole therewith are carried out, is lower than $10^{-7}$ Torr.

A sixth aspect of the present invention is directed to a process for manufacturing a semiconductor device in which a step of performing a reverse sputter etching with argon in the same vacuum atmosphere as in the step of forming the aluminum film or the aluminum alloy film is interposed between the step of forming the titanium film and the step of forming the aluminum film or the aluminum alloy film.

A seventh aspect of the present invention is directed to a process for manufacturing a semiconductor device in which a step of forming a titanium nitride (TiN) film is carried out before the step of forming the titanium film.

An eighth aspect of the present invention is directed to a process for manufacturing a semiconductor device in which the formation of the titanium film is carried out by arranging a plate provided with many openings between a target and the substrate, and then performing a sputtering process.

A process for manufacturing a semiconductor device of the present invention comprises forming a titanium film on an interlayered insulating film through which a via hole extending to a semiconductor element or a lower wire is formed, forming an aluminum film or an aluminum alloy film thereon at a low temperature, and then heating a substrate to melt the aluminum film or the aluminum alloy film, thereby filling the via hole therewith, said method being characterized in that the thickness of the titanium film is 10% or less of the thickness of the aluminum film or the aluminum alloy film and 25 nm or less, and particularly in the case of the aluminum film or the aluminum alloy film containing no silicon, the thickness of the titanium film is 5% or less of the thickness of the aluminum film or the aluminum alloy film and 25 nm or less. At the time of the formation of the aluminum film or the aluminum alloy film, temperature is preferably 200° C. or less, and the step of forming the aluminum film or the aluminum alloy film and the step of heating a substrate to melt the aluminum film or the aluminum alloy film are preferably carried out in one vacuum atmosphere. More preferably, a base pressure of a chamber where the series of steps are carried out is lower than $10^{-7}$ Torr.

Furthermore, a step of performing a reverse sputter etching with argon may be included after the formation of the titanium film.

In addition, the formation of the titanium film is carried out by arranging a plate (collimated plate) provided with many openings between a target and the substrate, and then performing a sputtering process.

Now, the present invention will be described in more detail with reference to examples. It should be noted that the scope of the present invention is not limited to these examples.

EXAMPLE 1

FIG. 1 shows the main process of the first embodiment of the present invention.

Figure 1A:
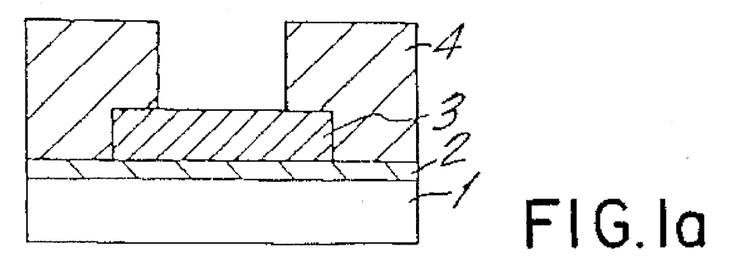
FIGS. 1a to 1d show sectional views illustrating the main process of the first embodiment of the present invention.

As shown in FIG. 1(a), an aluminum wire 3 is formed on a first interlayered insulating film 2 covering a silicon substrate 1, and the first interlayered insulating film 2 comprises, for example, a BPSG (boro-phosphosilicate glass) film and the aluminum wire 3 comprises, for example, an aluminum alloy film obtained by adding 0.5% of copper to aluminum. Furthermore, a second interlayered insulating film 4 is formed thereon with a silicon oxide film (plasma oxidized film) formed by a plasma CVD method, and a via hole reaching the first aluminum wire 3 is then formed at a desired position of the second interlayered insulating film 4. The second interlayered insulating film 4 is substantially flattened by a combination of the formation of an SOG (spin on glass) film and an etch back method.

Figure 1B:
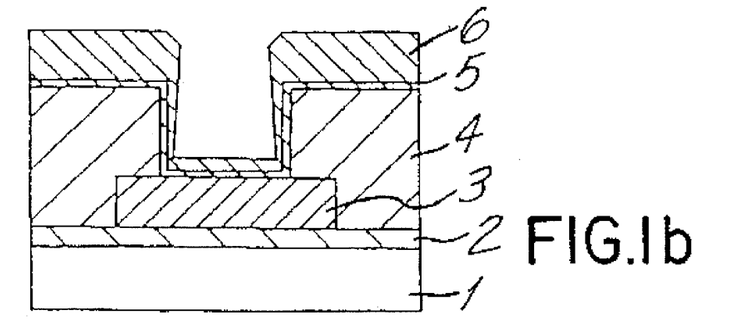

Next, the silicon substrate is placed in a sputtering device, and alumina formed on the surface of the first aluminum wire 3 exposed to the via hole is removed by reverse sputter etching with argon. Afterward, as shown in FIG. 1(b), a titanium film 5 and an aluminum alloy film 6 containing 0.5% of copper in aluminum are formed in turn by a sputtering process. The thickness of the titanium film 5 is 10 nm, and that of the aluminum alloy film 6 is in the range of about 0.4 to 0.8 μm. As the time of the formation of the aluminum alloy film 6, the temperature of the substrate is room temperature.

Figure 1C:
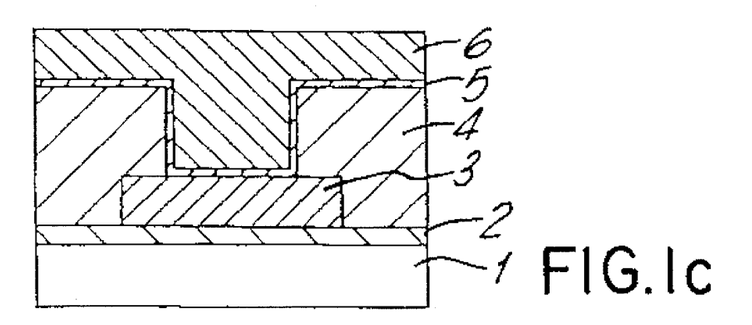

Afterward, as shown in FIG. 1(c), the silicon substrate 1 is heated at 450° to 550° C. for several minutes by the same sputtering system as used for the formation of the above-mentioned titanium film 5 and the aluminum alloy film 6, whereby the aluminum alloy film 6 flows to fill the via hole formed through the second interlayered insulating film 4. At this time, since the titanium film 5 is thin, all of this titanium film 5 reacts with the aluminum alloy film 6 to become a TiAlx alloy layer 7.

The series of steps are preferably carried out, keeping up the vacuum state in the one sputtering system, and in particular, the formation of the aluminum alloy film 6 and the fluidization of the aluminum alloy film 6 by heating the substrate are preferably performed in the one vacuum atmosphere. This reason is that if the formed aluminum alloy film 6 is exposed to the air, the surface of the aluminum alloy film 6 is oxidized, so that the aluminum alloy film 6 scarcely flows, and in order to make the aluminum alloy film 6 flowable, a further high temperature is required.

For the purpose of completely preventing the oxidation of the surface of the aluminum alloy film 6, it is necessary to set the base pressure in each process chamber to a vacuum level lower than $10^{-7}$ Torr. The employment of the high vacuum degree permits the aluminum alloy film 6 to flow at a lower temperature, and even if the titanium film is thin, a problem that aluminum becomes grains is not present any more. In particular, when the base pressure in each process chamber is in an order of $10^{-9}$ Torr, the temperature for the melting can be effectively lowered.

Figure 1D:
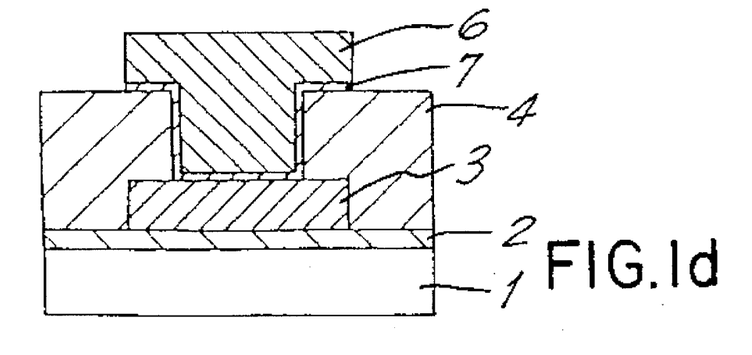

Next, as shown in FIG. 1(d), the aluminum alloy film 6 and the alloy layer 7 of aluminum and titanium are patterned to a desired shape, thereby forming a second aluminum wire comprising a layered structure the aluminum alloy film 6 and the alloy layer 7 of aluminum and titanium. In this embodiment, the titanium film is preferably as thin as possible, because in the case of the aluminum alloy film 6 containing no silicon, the thinner the titanium film 5 is, the better the via hole filling properties of the aluminum alloy film 6 are, and because the TiAlx alloy layer having a high resistance formed in the via hole is thin, whereby a via resistance can be decreased. However, if the titanium film 5 is not formed at all, the wetting of the aluminum alloy film 6 cannot be improved, and when the aluminum alloy film 6 is heated, it merely becomes grains and cannot fill the via hole. Furthermore, if the titanium film 5 is not present on the flat surface, crystalline grains of the aluminum alloy film 6 largely grow, and the boundaries i.e., the interfaces of the crystalline grains become deep grooves, and also in this case, the surface state of the aluminum alloy film 6 is bad.

The necessary smallest thickness of the titanium film 5 depends upon the aspect ratio of the via hole, and the higher the aspect ratio of the via hole is, the worse the covering ratio of the titanium film 5 is. Thus, when the aspect ratio is high, the thick titanium film 5 is required. When the aspect ratio is 1, the thickness of the titanium film 5 is 5 nm, and when the aspect ratio is 1.5, it is about 10 nm. In this case, the filling of the via hole is possible.

Figure 6:
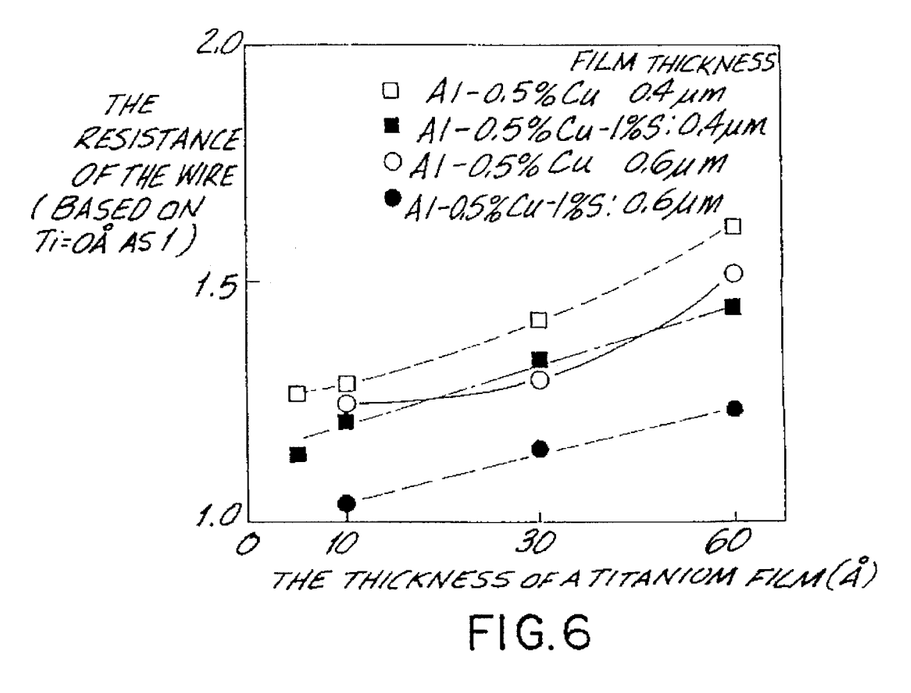
FIG. 6 shows a relation between the thickness of a titanium film and the resistance of a wire.

The thicker the titanium film 5 is, the thicker the formed TiAlx alloy layer 7 is, and the wire resistance increases, as shown in FIG. 6. Furthermore, the thicker the titanium film 5 is, the poorer a stress migration resistance is, and so the titanium film 5 on the flat portion is preferably thin. However, if the titanium film 5 is excessively thin, the titanium film 5 is scarcely formed in the via hole, so that the filling of the via hole by the melting of the aluminum alloy film is impossible.

Thus, if the titanium film 5 is subjected to sputter etching with an argon gas after the formation of the titanium film 5, the titanium film is thinned on the flat portion, but the titanium film in the via hole, particularly the titanium film on the side wall of the via hole is scarcely etched. Therefore, when the aluminum alloy film 6 is afterward formed and then heated for melting, the via hole having the same aspect ratio can be filled, even if the titanium film 5 on the flat portion is thin, in contrast to a case where the etching with argon is not done. For example, in the case of the via hole having the aspect ratio of 1.5, even if the titanium film 5 having a thickness of 12 nm is formed and then sputter-etched as much as 5 nm with argon so that the thickness of the flat portion of the titanium film 5 may be 7 nm, it is possible to fill the via hole with the aluminum alloy film 6.

Similarly, in order to fill the via hole having the high aspect ratio under conditions that the titanium film 5 on the flat portion is thin, the titanium film 5 may be formed by arranging a plate (collimated plate) provided with many openings, for example, the collimated plate having a thickness of 1 cm and provided with many 1-cm-diameter openings between a target and the substrate.

In the case that the titanium film 5 is formed by the use of the collimated plate, the sputtered particles of titanium having a large velocity component in a direction parallel to the substrate adhere to the collimated plate, and they do not reach the substrate. On the other hand, the sputtered particles having a small transverse component, i.e., the sputtered particles alone fed along a direction substantially vertical to the substrate adhere to the substrate. Therefore, the titanium film successfully adheres to the bottom of the via hole, and so it is possible to fill the via hole having the high aspect ratio, even if the titanium film is not thick, in contrast to a conventional sputtering process.

EXAMPLE 2

Figure 2A:
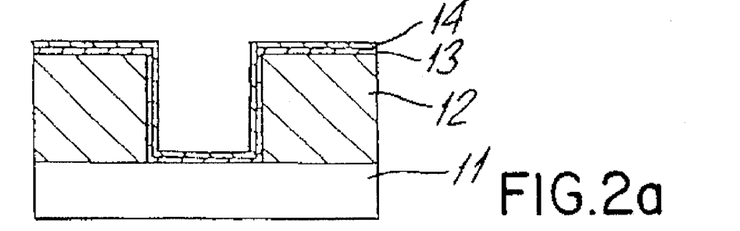
FIGS. 2a to 2e are sectional views illustrating the main process of the second embodiment of the present invention.
Figure 2B:
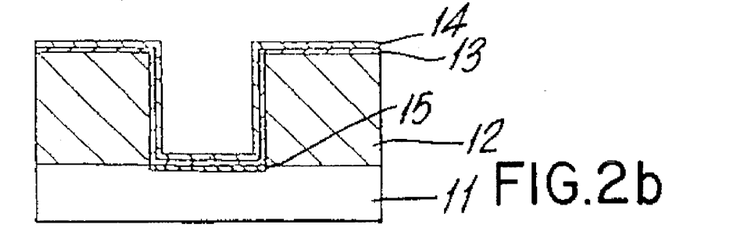

Next, as a second embodiment of the present invention, a case where the present invention is applied to a contact hole connected to a silicon substrate will be described with reference to drawings. As shown in FIG. 2(a), a contact hole is formed at a predetermined position of an interlayered insulating film 12 comprising, for example, a BPSG film which covers a silicon substrate 11 having semiconductor elements thereon, and a first titanium film 13 having a thickness of 20 to 60 nm and a TiN film 14 having a thickness of 40 to 150 nm are then formed by a sputtering process. Afterward, they are heated at a temperature of 600° to 700° C. for about 30 seconds in a nitrogen atmosphere by a halogen lamp. The reasons why this heating operation is given are as follows. In the TiN film 14 formed by the sputtering process, titanium which is not nitrided is contained, and so the TiN film 14 is poor as a barrier metal for preventing the interdiffusion of silicon and aluminum. Thus, the heating step permits titanium in the TiN film 14 to be nitrided, thereby improving barrier properties. In addition, the heating step permits reacting the first titanium film 13 with the silicon substrate 11 to form a titanium silicide film 15, as shown in FIG. 2(b), whereby a contact resistance can be lowered and stabilized.

Figure 2C:
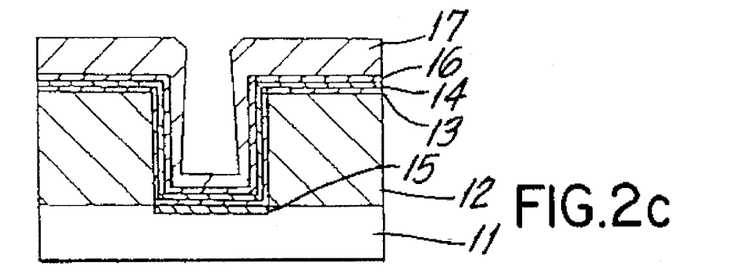

Next, as shown in FIG. 2(c), a second titanium film 16 having a thickness of 10 to 25 nm is formed by the sputtering process again, and successively, the temperature of the substrate is adjusted to room temperature. Afterward, an aluminum alloy film 17 obtained by adding 1% of silicon and 0.5% of copper to aluminum is formed as thick as 0.3 to 1.0 μm by the sputtering process.

Figure 2D:
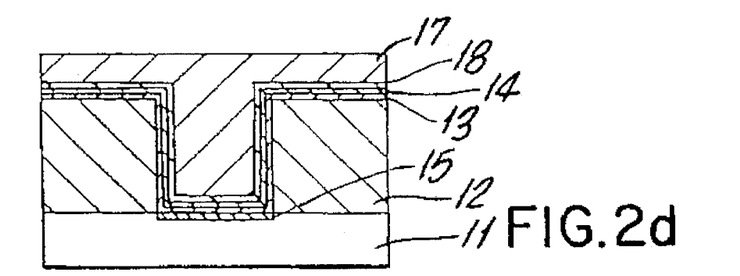

Afterward, the silicon substrate is heated at a temperature of 450° to 550° C. for several minutes, whereby the aluminum alloy film 17 flows to fill the contact hole, as shown in FIG. 2(d). At this time, the second titanium film 16 reacts with a part of the aluminum alloy film 17 to become a three-component alloy layer 18 of aluminum, titanium and silicon. The formation of the second titanium film 16 and the heating of the substrate are carried out in one system without exposing the second titanium film 16 to the air.

Figure 2E:
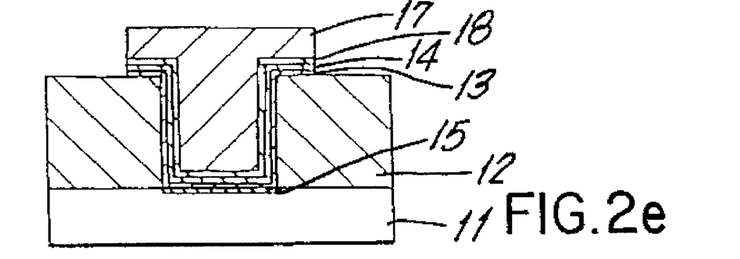

Next, as shown in FIG. 2(e), the aluminum alloy film 17 and the alloy layer 18 of aluminum, titanium and silicon are patterned to a desired shape to complete an aluminum wire.

In this embodiment, for the purpose of preventing the interdiffusion of aluminum and silicon, the TiN film 14 is provided under the second titanium film 16, and so the second titanium film 16 can be protected from oxidation. Therefore, if the same aluminum alloy film as in the first embodiment is used, the titanium film may be thinner than in the first embodiment. However, if silicon is added to the aluminum alloy film and the titanium film is excessively thin, the wetting of the aluminum alloy film is poor, because the diffusion of titanium in aluminum is inhibited by silicon. In consequence, it is difficult that the aluminum alloy film is molten by heating the substrate to fill the contact hole.

For these reasons, in this embodiment, the thickness of the second titanium film 16 is preferably 10 nm or more. However, in consideration of the bad surface state of the aluminum alloy film 17, the resistance to stress migration and the increase in a wire resistance, the thickness of the second titanium film 16 is preferably 25 nm or less.

As described above, if silicon is present in the aluminum alloy film 17, the diffusion of titanium in aluminum is inhibited, so that the layer of an alloy with titanium is thin. Therefore, as shown in FIG. 6, when the aluminum alloy film containing silicon is molten, the wire resistance is lower, as compared with the aluminum alloy film containing no silicon, under conditions that the thickness of the films is equal. Moreover, when the aluminum alloy film containing silicon is used, the stress migration by which a part of the aluminum alloy wire is lost scarcely occurs. On the other hand, the aluminum alloy film containing no silicon flows more easily, when the titanium film is thin, but the aluminum alloy film containing silicon flows more easily, when the titanium film is thick. Hence, when the aluminum alloy film contains silicon, the titanium film is required to be thicker than when the aluminum alloy film contains no silicon. Even if the titanium film is thick, little affection is present.

The aluminum surface state, the wire resistance and the stress migration resistance depend upon the thickness of the titanium film to the aluminum alloy film, and when the aluminum alloy film is thick, little bad influence is present, even if the titanium film is thick.

In the case of the aluminum alloy film containing silicon, the contact hole can be easily filled, when the titanium film is thick. However, in order to prevent the deterioration of the quality of the aluminum alloy film by titanium, the thickness of the titanium film is required to be less than 10% or less of the thickness of the aluminum alloy film. Nevertheless, even if the thickness of the titanium film is more than 25 nm, the filling properties of the contact hole with the aluminum alloy film do not change any more, and hence the thickness of the titanium film is at most 25 nm.

On the contrary, in the case of the aluminum alloy film containing no silicon, the TiAlx alloy layer can be thickly formed, because the diffusion of titanium is not inhibited by silicon. In order to prevent the deterioration of the quality of the aluminum alloy film by titanium, it is necessary that the titanium film is further thinned and the thickness of the titanium film is required to be 5% or less of the thickness of the aluminum alloy film. In the case of the aluminum alloy film containing no silicon, the thinner the titanium film is, the more easily the contact hole is filled with the aluminum alloy film. Therefore, even if the thickness of the titanium film is 5% or less of the thickness of the aluminum alloy film, the filling of the contact hole is possible. However, when the thickness of the aluminum alloy film is as thick as 0.6 μm or more, the AlTi alloy layer is thickly formed, even if the thickness of the titanium film is 5% or less of the aluminum alloy film. In consequence, a wire resistance noticeably increases, and the stress migration easily occurs. Hence, the thickness of the titanium film is preferably much less than 5% of the aluminum alloy film. That is to say, if the thickness of the titanium film is regulated to be less than 25 nm, the occurrence of the stress migration can be suppressed, even if the aluminum alloy film is as thick as 0.6 μm or more. Therefore, also in this case, the thickness of the titanium film is required to be at most 25 nm.

In addition, when a layer under the titanium film is the TiN film, the titanium film can be further thinned, because of no oxidation of the titanium film.

As described above, the present invention is concerned with a process for filling a via hole such as a contact hole provided through an interlayered insulating film with an aluminum alloy, and a process which comprises forming an aluminum alloy film at a low temperature by a sputtering process after the formation of a titanium film, and then heating a substrate to melt the aluminum alloy film. In the present invention, the thickness of the titanium film is 10% or less of the thickness of the aluminum alloy film and at most 25 nm, and particularly in the case of the aluminum alloy film containing no silicon, the thickness of the titanium film is 5% or less of the thickness of the aluminum alloy film and at most 25 nm. According to this constitution, deteriorations of the quality of the aluminum alloy film by titanium such as the decline of the surface of the aluminum alloy film, the increase in a wire resistance and the deterioration of a stress migration resistance can be minimized, and the via hole provided through the interlayered insulating film can be effectively filled with the aluminum alloy film.

What is claimed is:

1. A process for manufacturing a semiconductor device, comprising the steps of forming a titanium film on a via hole and an interlayered insulating film through which the via hole extending to a semiconductor element or a lower wire is formed; forming an aluminum film or an aluminum alloy film at a temperature of 200° C. or lower by a sputtering process; and heating a substrate to melt the aluminum film or the aluminum alloy film, thereby filling the via hole therewith, the thickness of the titanium film being 10% or less of the thickness of the aluminum film or the aluminum alloy film and being 25 nm or less, wherein at least the step of forming the aluminum film or the aluminum alloy film and the step of heating the substrate to melt the aluminum film or the aluminum alloy film, thereby filling the via hole therewith are carried out in same vacuum atmosphere in a chamber; and wherein a step of performing a reverse sputter etching of the titanium film with argon in the same vacuum atmosphere as in the step of forming the aluminum film or the aluminum alloy film is interposed between the step of forming the titanium film and the step of forming the aluminum film or the aluminum alloy film.

2. The process for manufacturing a semiconductor device according to claim 1 wherein a base pressure of the chamber, where the step of forming the aluminum film or the aluminum alloy film and the step of heating the substrate to melt the aluminum film or the aluminum alloy film and to thereby fill the via hole therewith are carried out, is lower than $10^{-7}$ Torr.

3. The process for manufacturing a semiconductor device according to claim 1 wherein a step of forming a titanium nitride film (a TiN film) is initially carried out under the titanium film before the step of forming the titanium film.

4. The process for manufacturing a semiconductor device according to claim 1 wherein the formation of the titanium film is carried out by arranging a plate provided with many openings between a target and the substrate, and then performing a sputtering process.

5. The process for manufacturing a semiconductor device according to claim 1 wherein a base pressure of the chamber, where the step of forming the aluminum film or the aluminum alloy film and the step of heating the substrate to melt the aluminum film or the aluminum alloy film and to thereby fill the via hole therewith are carried out, is about $10^{-9}$ Torr.

* * * * *